(12) United States Patent
Alirezaei et al.

(10) Patent No.: US 12,091,051 B2
(45) Date of Patent: Sep. 17, 2024

(54) GENERATING UNKNOWN-UNSAFE SCENARIOS, IMPROVING AUTOMATED VEHICLES, AND COMPUTER SYSTEM

(71) Applicant: Siemens Industry Software NV, Leuven (BE)

(72) Inventors: Mohsen Alirezaei, Eindhoven (NL); Frank Rijks, Tegelen (NL); Martijn Schut, Uitgeest (NL)

(73) Assignee: Siemens Industry Software NV, Leuven (BE)

( * ) Notice: Subject to any disclaimer, the term of this patent is extended or adjusted under 35 U.S.C. 154(b) by 0 days.

(21) Appl. No.: 18/278,400

(22) PCT Filed: Jan. 7, 2022

(86) PCT No.: PCT/EP2022/050269
§ 371 (c)(1),
(2) Date: Aug. 22, 2023

(87) PCT Pub. No.: WO2022/179759
PCT Pub. Date: Sep. 1, 2022

(65) Prior Publication Data
US 2024/0092394 A1    Mar. 21, 2024

(30) Foreign Application Priority Data

Feb. 23, 2021  (EP) .................................. 21158742

(51) Int. Cl.
*B60W 60/00* (2020.01)
(52) U.S. Cl.
CPC .... *B60W 60/0016* (2020.02); *B60W 60/0011* (2020.02)

(58) Field of Classification Search
CPC .......... B60W 60/001; B60W 60/0011; B60W 60/0015–00188; B60W 60/0027–00276; B60W 60/0059
See application file for complete search history.

(56) References Cited

FOREIGN PATENT DOCUMENTS

CN    111666921 B    5/2022

OTHER PUBLICATIONS

Balasubramaniyan, Prasanna, "Designing AI enabled System with SOTIF (Safety Of The Intended Functionality)", accessed Dec. 14, 2019, https://www.design-reuse.com/articles/46970/designing-ai-enabled-system-with-sotif-safety-of-the-intended-functionality.html (Year: 2019).*

Forrai, Alexandru et al: "Delivering safe automated driving systems—Identifying trends in testing and certification for autonomous vehicles targeting automation level 4", Siemens White paper; Jan. 1, 2020 (Jan. 1, 2020), pp. 1-17.

(Continued)

*Primary Examiner* — Spencer D Patton
(74) *Attorney, Agent, or Firm* — Lempia Summerfield Katz LLC

(57) ABSTRACT

A computer-implemented method for generating unknown-unsafe scenarios for assessing and improving the safety of automated vehicles includes a first process of providing a plurality of different scenarios. To improve the safety of automated vehicles and the efficiency of designing these, a second process of reducing the plurality of different scenarios to scenarios that are unknown-unsafe scenarios is provided.

9 Claims, 6 Drawing Sheets

(56) References Cited

OTHER PUBLICATIONS

PCT International Search Report and Written Opinion of International Searching Authority mailed May 12, 2022 corresponding to PCT International Application No. PCT/EP2022/050269.
Siemens: "Critical Scenario Creation for Verification and Validation of Cooperative and Automated Driving functionalities Where today meets tomorrow"; Dec. 24, 2020 (Dec. 24, 2020), pp. 1-25.
Trollet, Fabrice: "Autonomous Vehicle Validation: Method to generate variability on known uses cases and to discover new unknow unsafe uses cases required by ISO21448 SOTIF"; Jan. 31, 2020 (Jan. 31, 2020), pp. 1-8.
International Preliminary Report on Patentability for International Application PCT/EP2022/050269 mailed Apr. 17, 2023.

* cited by examiner

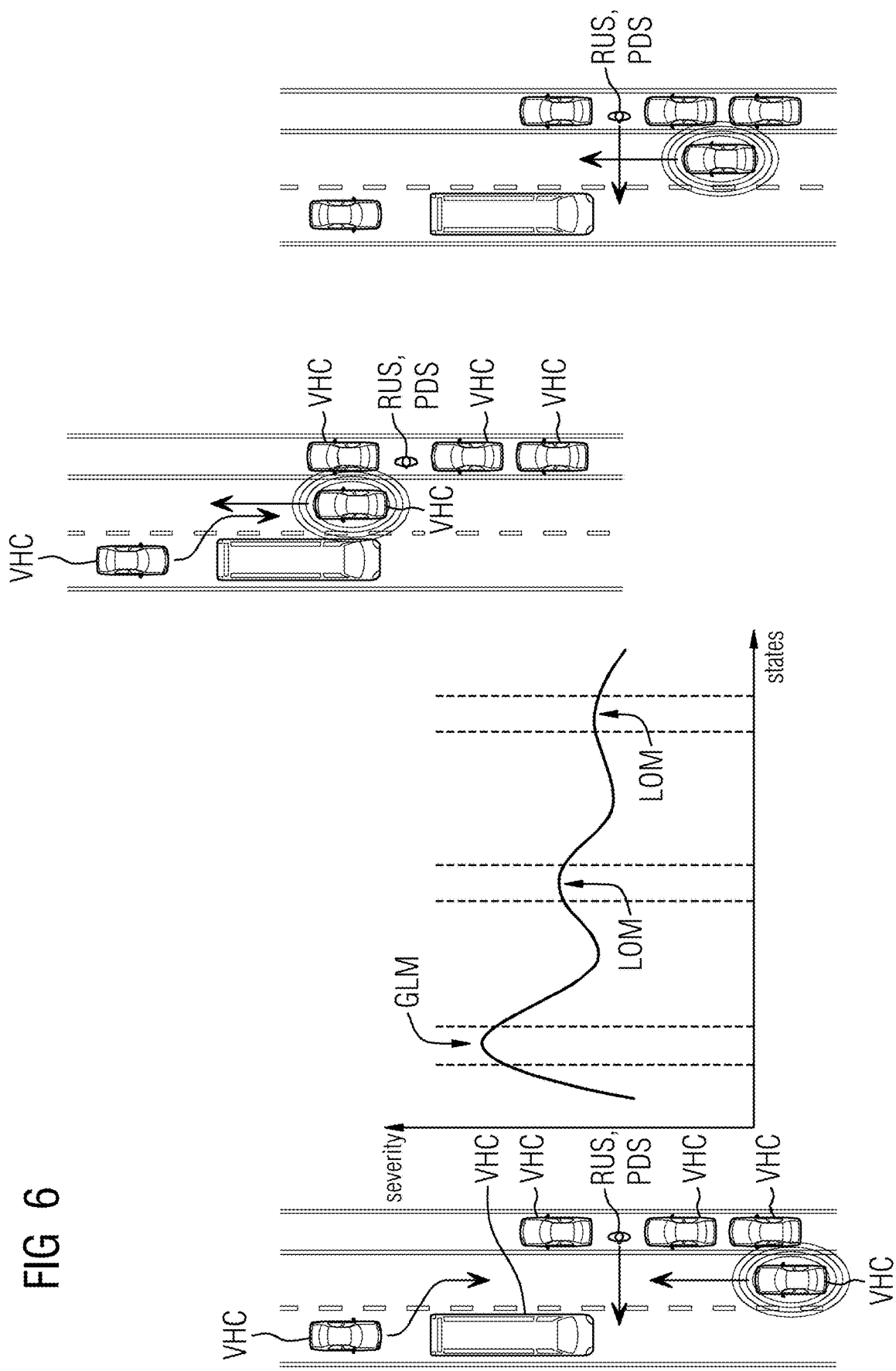

GENERATING UNKNOWN-UNSAFE SCENARIOS, IMPROVING AUTOMATED VEHICLES, AND COMPUTER SYSTEM

This application is the National Stage of International Application No. PCT/EP2022/050269, filed Jan. 7, 2022, which claims the benefit of European Patent Application No. EP 21158742.3, filed Feb. 23, 2021. The entire contents of these documents are hereby incorporated herein by reference.

FIELD

The present embodiments relate to generating unknown-unsafe scenarios.

BACKGROUND

Over the last years, significant progress has been made in development of automated driving functionalities and technologies (e.g., sensor technology, high performance computing, machine learning, computer vision, etc.). However, despite vast development in automated driving functionalities, introduction of fully automated vehicles capable of driving in unstructured environments without supervision remains a long-term goal.

Relevant prior art disclosures may be considered as: Anonymous, "Critical Scenario Creation for Verification and Validation of Cooperative and Automated Driving functionalities Where today meets tomorrow," 24 Dec. 2020 (2020-12-24), pages 1-25, XP055914080; Fabrice Trollet, "Autonomous Vehicle Validation: Method to generate variability on known uses cases and to discover new unknow unsafe uses cases required by ISO21448 SOTIF," 31 Jan. 2020 (2020-01-31), pages 1-8, XP055914137, https://www.embedded-france.org/wp-content/uploads/2020/03/ERTS2020 Proceedings Final.pdf; Forrai Alexandru et al., "Delivering safe automated driving systems—identifying trends in testing and certification for autonomous vehicles targeting automation level 4," Siemens White paper, 1 Jan. 2020 (2020-01-01), pages 1-17, XP055849481.

The main driver assistance systems on the market today are categorized as SAE level 1 or 2 (e.g., Automation level 1: Assisted mode—certain assistance systems help with vehicle operation, such as adaptive cruise control (ACC); Automation level 2—Assisted mode, partial automation; functions such as automatic parking, lane keeping, general longitudinal guidance, acceleration, braking are performed by the assistance systems, such as traffic Jam Assist) and have been configured for specific situations. In comparison, systems with higher levels of autonomy (e.g., SAE level 3, 4, 5) must be thoroughly tested and be robust in complex traffic situations, adverse weather, lighting conditions, and evolving scenarios (e.g., including edge/corner cases and rare but safety-relevant events). This would require an enormous number of test drive kilometers before the systems may be safely launched on the market. This provides that the conventional validation approaches, processes, and tools cannot efficiently handle the challenging problem of validating these new systems.

To assess the safety of Automated vehicles (AVs), various aspects are to be considered. First, safe operation is to be provided through functional safety, as described in ISO26262 (Road vehicles—Functional safety). This standard deals with hazards induced by technical failures due to systematic and random faults in both hardware and software. Additionally, the Safety of the Intended Functionality (SO-TIF) is to be provided. SOTIF focuses on mitigating risks and hazards that result from functional insufficiencies, in the absence of technical system failures. SOTIF analysis covers identification of system weaknesses as well as scenarios that lead to a hazardous event.

According to SOTIF, scenarios are categorized based on two properties: First, scenarios are either known or unknown, depending on whether the scenarios were already foreseen by the designer or not. Second, scenarios are either safe or unsafe. This results in four types of scenarios: known-safe; known-unsafe; unknown-unsafe; and unknown-safe.

SOTIF analysis concentrates mainly on identifying unknown-unsafe scenarios. When an unsafe scenario has been found, its risk may be mitigated.

Identifying unknown-unsafe scenarios for SOTIF assessment is an open challenge.

To obtain such scenarios, it is known to extract the scenarios from data, such as test drives or accident databases. However, extraction from test drives still needs a lot of test kilometers. Extraction from accident databases has the disadvantage that these currently involve a human driver. These may not be representative since scenarios that are hazardous for a human driver may not be hazardous for an automated driving system. Automated driving functionality may introduce new hazards.

SOTIF considers hazardous events that are caused by potential system hazards in combination with particular operating situations. Hence, detecting such hazards requires the identification of unsafe scenarios that trigger the hazard and were unknown before. The terms criticality and novelty are used to indicate the potential of a scenario to be unsafe and unknown, respectively. The state-of-the-art scenario identification techniques for safety assessment are categorized.

One known method is knowledge-based scenario generation. Many factors may be considered when generating scenarios based on knowledge. Some aspects of an autonomous vehicle such as the operational design domain, object and event detection and response, vehicle maneuvers, and fault management are to be validated. For example, an operational design domain taxonomy and ontology-based scenario generation are the approaches that guide how different elements may be combined to scenarios.

Another known method is a scenario identification by parameter variation. In this approach, the scenario creation starts from logical scenarios. The parameter ranges are sampled, with the aim of finding critical scenarios. Criticality indicators or fitness functions may be used to distinguish relevant scenarios from irrelevant ones. A relevant/logical scenario starts with a functional scenario and then is obtained by defining parameter ranges. Key Performance Indicators (KPIs) are assigned to each logical scenario, which are used as criticality indicator. Then, concrete scenarios may be selected using parameter variation.

Another known method is a scenario identification with automatic optimization or falsification. In this approach, scenario creation starts with a (set of) concrete scenario and then increases complexity or criticality of the scenario. Criticality indicators or objective functions are used to support the search. In most cases, optimization is done in an iterative fashion using simulations. The approach is based on reachability analysis and aims at testing motion planners. The anticipated reachable set is determined first. This set contains all reachable states excluding those that will inevitably cause an accident. To compute reachable sets, vehicle models are to be provided. Then, the drivable area is obtained by computing the area of all positions corresponding to the anticipated reachable set. The drivable area is used as criticality measure. Next, optimization routines are used to shrink the drivable area.

Another known method is a data-based scenario identification. The methods that were discussed in previous sections based the generation of scenarios on knowledge. In contrast, the methods that will be presented in this section extract scenarios from data. The first two contributions deal with detection of collisions that may have been avoided by the automated driving system under test. Data-based scenario selection for statistical estimation of collision frequency may be subdivided into the following groups.

Collision avoidance in stochastic simulations—In this method, scenarios are selected from an accident database. Next, stochastic simulations are used to evaluate safety effectiveness of the automated driving system. Various parameters are swept (e.g., the behavior of other traffic participants corresponding to their respective models). This way, it may be determined if the automated driving system may have avoided the accident. This approach requires very detailed accounts of accidents and only provides limited information about new potential hazards that may have been introduced by the automated functionality itself.

Search-based avoidable collision—Mainly, two search-based approaches for finding avoidable collisions in simulations are used. An avoidable collision is defined as a collision that occurs in a specific scenario with a certain configuration of the automated driving system under test, but which will be avoided if the system is configured differently. The first is a sequential approach, in which the danger of a scenario is first maximized to find a collision. Then, a multi-objective search is performed to find different weights that do not yield a collision in the same scenario. The objectives are to minimize the danger and to minimize the distance between the initial weights and reconfigured weights.

The second approach is a multi-objective approach that combines searching for a collision with the alternative configuration that avoids the collision. The objective of minimizing the distance between the original and reconfigured weights remains the same.

Scenario selection for extreme value theory—In this method, the frequency of collisions is estimated statistically. Accident data including sensor data is used, so that the closeness to a collision may be computed. With extreme value theory, the frequency of near-collision events may be extrapolated to yield the estimated frequency of actual collisions.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a method including a second process of reducing a plurality of different scenarios to scenarios that are unknown-unsafe scenarios is provided to solve the above-explained problems and disadvantages of the conventional methodology.

The present embodiments refer to a "scene" as an environment in which a "scenario" takes place. For example, a location, weather condition, and lighting condition may define one scene.

In the wording of the present embodiments, a "basic scenario element" is defined as an abstracted model that describes the behavior or the movement of a road user in lateral and longitudinal direction. This behavior may be understood as the horizontal movement of the respective participant.

According to the present embodiments, a "scenario" is the combination of all road users and their respective basic scenario elements (e.g., their behavior) in a certain scene.

In the wording of the present embodiments, a "3D-environment" may be understood as a 3D interactive environment having a figurative appearance. The 3D-environment allows interaction (e.g., mechanical interaction between contact patches of tires of a vehicle and corresponding contact surfaces of the 3D-environment; further sensor-interaction, such as electromagnetic; optical interaction between sensors of the vehicle and the 3D-environment).

The use of "a" or "an" throughout this application does not exclude a plurality, and "comprising" does not exclude other steps or elements. Also, elements described in association with different embodiments may be combined. Reference signs in the claims should not be construed as limiting the scope of the claims.

Comparing construction of scenarios from knowledge bases with the search for scenarios from recorded data yields to the following similarities and differences.

Similarities between these methods may, for example, be that simulation of scenarios is important. Further, most methods require criticality indicators or objective functions to distinguish between critical or non-critical scenarios.

As a difference, one group of approaches starts from logical scenarios and then samples the parameter space. This may either be done using normal sampling, stochastic variation of parameters, or a combinatorial testing approach. Other approaches start with one or a set of concrete scenarios and apply an optimization procedure, mostly iterative. Optimization is done using, for example, transition-based RRT, evolutionary algorithms, single- and multi-objective optimization.

As discussed, current scenario identification methods often focus only on criticality and on potentially unsafe situations, but not necessarily on those that are unknown. Meanwhile, various definitions and indicators for criticality are used.

As another example, a generic method that targets identifying scenarios that are both unknown and unsafe is provided.

In accordance with the present embodiments, a solution for the above-described problems by the defined method further includes a second process of reducing the plurality of different scenarios to scenarios that are unknown-unsafe scenarios. The second process further includes reducing the plurality of scenarios toward a higher portion of unknown-unsafe scenarios by determining, for each scenario, a severity indicator as a change of criticality over time, and discarding scenarios with a severity indicator not exceeding a predefined threshold.

One embodiment of the method includes: collecting data and importing data to a simulation environment by generation of a 3D-environment; selecting a scene and extracting basic scenario elements; selecting a number and type of road users and massive scenario generation; and optimizing toward unknown-unsafe scenarios.

In an embodiment, the first process of providing a plurality of different scenarios may include: act 1—collecting data and importing data to a simulation environment by generation of a 3D—environment; act 2—selecting a scene and extracting basic scenario elements from the scene; act 3—selecting a number of road users, selecting the type of each road user, and generating a number of different scenarios.

In one embodiment, collecting real world data involves using sensor recordings of sensors of: drones; roadside sensors; vehicles equipped with sensor sets; fleet of normal vehicles; or any combination thereof. For example, using a combination or all of these possibilities enables an increasingly realistic simulation, resulting in an efficient testing and most valuable improvement of the safety of the autonomic driving system.

In accordance with the present embodiments, generating a 3D-environment converts data of the real-world recordings into an interactive simulation facility (e.g., respectively 3D-environment), enabling interaction between the vehicle and its surrounding (e.g., mechanical interaction between ground/paving and tires). This interactive 3D-environment further enables amendments to the scene and the scenario. These amendments are one element to generating multiple scenarios including scenarios of particular interest giving a significant potential to improve the autonomic driving system.

According to the present embodiments, the second process includes act 4, in which the plurality of different scenarios are reduced to a more selected plurality of scenarios that include a higher portion of unknown-unsafe scenarios (e.g., that include only unknown-unsafe scenarios). While one of the previous acts enables amendments to scenarios and the generation of multiple different scenarios, not all these scenarios generated may be sufficiently useful to improve the safety of the autonomic driving system. Act 4 therefore provides a selection of the interesting scenarios.

Another embodiment provides that act 1 further includes sub-acts, as: (1a) collecting data by measuring and recording of measurements of real scenario data by sensors; (1b) providing recordings of sensor measurements of real scenario data of a number of scenarios into a data collection; (1c) importing data of the data collection to a simulation environment; and (1d) generating of at least one 3D-environment from the data collection by the simulation environment.

Another embodiment provides that act 2 includes: (2a) selecting a scene from the 3D-environment for setting up a scenario; and (2b) extracting basic scenario elements from the scene.

For example, the extraction of basic scenario elements gives way to interactivity, modularity, and variability of the scenario without losing the reality of the real data recordings.

One embodiment provides amending of scenarios by sub-acts: (3a) selecting of number and type of road users for generating a scenario; and subsequently, (3b) generating a plurality of scenarios based on selected number and type of road users. This process of variation of the real-world data is efficient and results in good scenario quality.

According to another embodiment of the act 4 includes the sub-act: (4a) reducing the plurality of scenarios toward a higher portion of unknown-unsafe scenarios by determining, for each scenario, a severity indicator as a change of criticality over time. According to this embodiment, scenarios with a severity indicator that indicate that the scenario is less unknown-unsafe may be discarded. Therefore, scenarios with a severity indicator amount not exceeding a predefined criticality threshold are more likely to be known before, and therefore, do not qualify to be unknown according to this embodiment and may be discarded.

In one embodiment, the severity indicator may be defined as: the time derivative of a criticality indicator; the time derivative of a combination of criticality indicators; as an amount of the time derivative of a criticality indicator; or a combination of criticality indicators.

Such combination may be a weighted sum of a number of criticality indicators.

This definition beneficially reflects that the scenario is unknown, surprising to the respective road user, the respective vehicle, and the autonomous driving system.

In one embodiment, one criticality indicator, or as a variant of the present embodiments, the only criticality indicator, may be a prognosed time-to-collision. The severity indicator may be modelled as an amount of the time derivative of the prognosed time-to-collision or alternatively as a negative time derivative of the prognosed time-to-collision. Other algorithmic options are possible as well (e.g., reciprocal value or negative reciprocal value of the time derivative of the prognosed time-to-collision).

The option "negative time derivative of the prognosed time-to-collision," for example, enables evaluation of both attributes: the unknown, or surprisingness, attribute and the unsafety, or hazardousness, attribute by evaluating only one parameter. The surprisingness and the hazardousness increase with increasing severity indicator. Other criticality indicators may relate to the road condition. The road may be wet, slippery, or icy depending on the amount of humidity, moisture, rain, and the temperature. These factors may influence the tire traction. A surprisingness (e.g., unknown) of change of such conditions, such as sudden black ice, fog, or thunderstorm, may be quantified as the amount of the time derivative of these criticality indicators.

The prognosed time-to-collision or, in short, time-to-collision value at an instant is defined as the time that remains until a collision between two road users or vehicles would have occurred if the collision course and speed difference are maintained.

One useful variant of the present embodiments provides that amending the scene or scenario includes: (1e) identifying at least one occluded part of at least one trajectory of at least one road user in the 3D-environment and filling the occluded part; (1f) removing at least one dynamic object from at least one trajectory of at least one road user in the 3D-environment to have smooth trajectories; (1g) adding virtual sensors to at least one road user; or any combination thereof.

For example, the present embodiments deal with an apparatus and/or a method for improving the safety of an automated vehicle. The apparatus is configured to perform the method, and the method includes: providing a driver assistance system (e.g., an advanced driver assistance system (ADAS)) including at least one processor (e.g., a processor). The processor is configured for controlling interventions semi-autonomously or autonomously in the operation of the vehicle. The operation of the vehicle may be considered as driving the vehicle (e.g., accelerating, braking), controlling specific maneuvers (e.g., parking-steering assistant), reading signaling devices, or warning the driver through suitable human-machine interfaces shortly before or during critical situations. The method also includes providing at least two (e.g., two when comparing only two different settings) parameter (ADAS-parameter) settings for configuring the interventions controlling behavior, testing at least parts of the driver assistance systems (e.g., advanced driver assistance systems) in a loop (e.g., something in the loop XiL; hardware in the loop HiL (https://de.wikipedia.org/wiki/Hardware_in_the_Loop)) with a simulation of at least one unknown-unsafe scenario generated by a method, as described above and/or below, with a number of different parameter settings, and selecting at least one parameter setting of the number of different parameter settings performing better than the other parameter settings regarding predefined criteria. The method also includes configuring the automated vehicles driver assistance system (ADAS) by one of the selected parameter settings and driving the automated vehicles with the configured driver assistance system (ADAS).

In one embodiment, providing parameter (ADAS-parameter) settings for configuring the intervention controlling behavior may be done by choosing, in a first guess, arbitrarily any, for example, reasonable value (e.g., feasible value) for each parameter, or by following an optimizing strategy of choosing reasonable (e.g., feasible) intervals for each parameter and picking, for example, equidistant values from these intervals to, for example, cover the full range. These values of the different parameters may be combined randomly or systematically, and the respective driver assistance system parameter performance may be compared.

The comparison of the respective driver assistance system parameter performance may be done by comparing maximum, minimum, amount of criticality (e.g., depending on the criticality indicator), criticality values during the respective scenarios, criticality integrals, ratios of criticality/severity, or other known criteria to evaluate the resulting safety respectively safety improvement.

Further, the present embodiments relate to the apparatus (e.g., a computer system including at least one processor). The at least one processor is configured to perform the method according to the present embodiments or a variant of the present embodiments.

An apparatus for carrying out the method according to the present embodiments may be a computer, personal computer, or a workstation in a computer network and includes a central processing unit, a system memory, and a system bus that couples various system components including the system memory to the central processing unit. The system bus may be any of a number of types of bus structures including a memory bus or memory controller, a peripheral bus, and a local bus using any of a variety of bus architectures. The system memory may include read only memory (ROM) and/or random-access memory (RAM). A basic input/output system (BIOS), containing basic routines that help to transfer information between elements within the personal computer, such as during start-up, may be stored in ROM. The computer may also include a hard disk drive for reading from and writing to a hard disk. The hard disk drive may be coupled with the system bus by a hard disk drive interface. The drive and its associated storage media provide nonvolatile storage of machine-readable instructions, data structures, program modules, and other data for the computer. Although the example of the environment described herein employs a hard disk, those skilled in the art will appreciate that other types of storage media, such as flash memory cards, digital video disks, random access memories (RAMs), read only memories (ROM), and the like, may be used instead of, or in addition to, the storage devices introduced above. A number of program modules may be stored on the hard disk, ROM or RAM, such as an operating system, one or more application programs, such as the method for estimating and/or other program modules, and/or program data, for example.

Further possible implementations or alternative solutions of the present embodiments also encompass combinations of features described above or below with regard to the embodiments but not explicitly mentioned herein. The person skilled in the art may also add individual or isolated aspects and features to the most basic form of the invention.

Up to now, the invention has been described with respect to the claimed method and apparatus. Features, advantages, or alternative embodiments herein may be assigned to the other claimed objects (e.g., the computer program or a device, such as the apparatus or a computer program product) and vice versa. In other words, the subject matter that is claimed or described with respect to the device may be improved with features described or claimed in the context of the method and vice versa. In this case, the functional features of the method are embodied by structural units of the system and vice versa, respectively. Generally, in computer science, a software implementation and a corresponding hard-ware implementation are equivalent. Thus, for example, a method act for "storing" data may be performed with a storage unit, and respective instructions to write data into the storage may be provided. For the sake of avoiding redundancy, although the apparatus may also be used in the alternative embodiments described with reference to the method, these embodiments are not explicitly described again for the apparatus.

It is part of the invention that not all acts of the method necessarily have to be performed on the same component or computer instance but may also be performed on different computer instances.

In addition, it is possible that individual acts of the method described above may be carried out in one unit and the remaining components in another unit, as a distributed system. The properties, features, and advantages of this invention described above, as well as the manner they are achieved, become clearer and more understandable in the light of the following description and embodiments, which will be described in more detail in the context of the drawings. This following description does not limit the invention on the contained embodiments. Same components or parts may be labeled with the same reference signs in different figures. In general, the figures are not for scale. An embodiment of the present invention may also be any combination of the dependent claims or above embodiments with the respective independent claim.

BRIEF DESCRIPTION OF THE DRAWINGS

FIG. 6 shows multi objective optimization for a scene with three dynamic road users.

In different figures, similar or same elements may be provided with the same reference signs.

DETAILED DESCRIPTION

Figure 1:
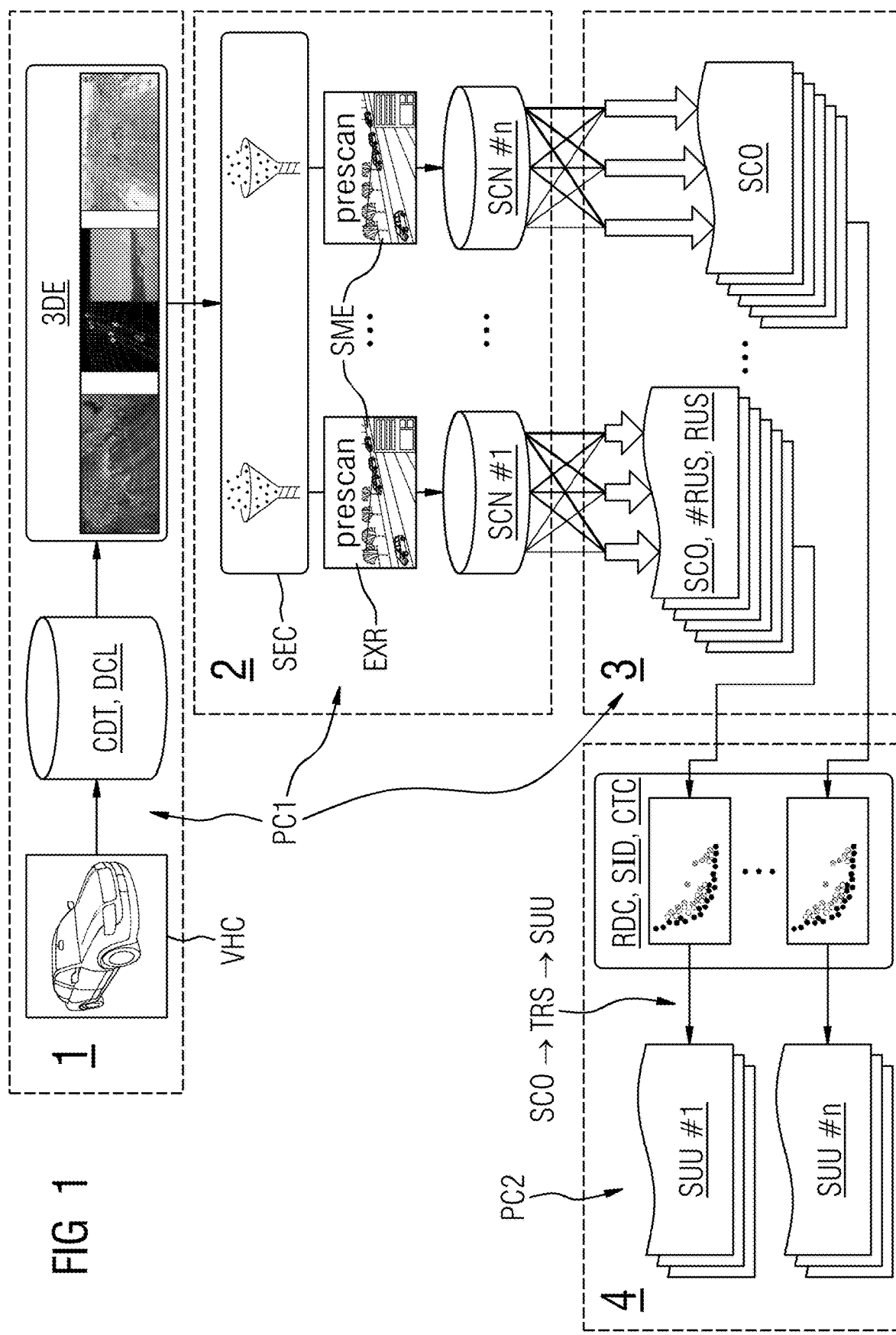
FIG. 1 depicts acts of a method according to an embodiment.

FIG. 1 shows a simplified flow diagram illustrating acts of a method according to the present embodiments.

A more general clustering of the method according to the present embodiments includes a first process PC1 of providing a plurality of different scenarios SCO, and a second process PC2 of reducing the plurality of different scenarios SCO to scenarios SCO that are unknown-unsafe scenarios SUU.

More broken down to details, the first process PC1 includes act 1: collecting data CDT by measuring and recording measurements of real scenario SCO data by sensors SNR (e.g., collecting data CDT from real vehicle VHC operation) and importing data CDT of said data collection DCL to a simulation environment SME and generating at least one 3D-environment 3DE from the data collection DCL by the simulation environment SME. The first process PC1 also includes act 2: selecting a scene SCN from the 3D-environment 3DE for setting up a scenario SCO and extracting basic scenario SCO elements SEL from the scene SCN. The first process PC1 also includes act 3: selecting of a number #RUS of road users RUS, selecting a type of each road user RUS, and generating a plurality of scenarios SCO based on the selected number and type of road users RUS.

More broken down to details, the first process PC1 further includes: act 4 of reducing RDC the plurality of scenarios SCO toward a higher portion of unknown-unsafe scenarios SUU by determining, for each scenario SCO, a severity indicator SID as a change of criticality CTC over time, and discarding scenarios SCO with a severity indicator SID having an amount that does not exceed a predefined threshold TRS.

First, scene locations, weather, and lighting condition may be chosen, and then, data may be collected in the selected scenes SCN. By focusing on a specific scene location, the efficiency of the data collection increases by finding more variant of scenarios for different road users. Also, this increases the likelihood of finding rare scenarios in one location. A different approach for data collection may be implemented. In general, real data may be collected, or synthetic data may be generated.

Figure 2:
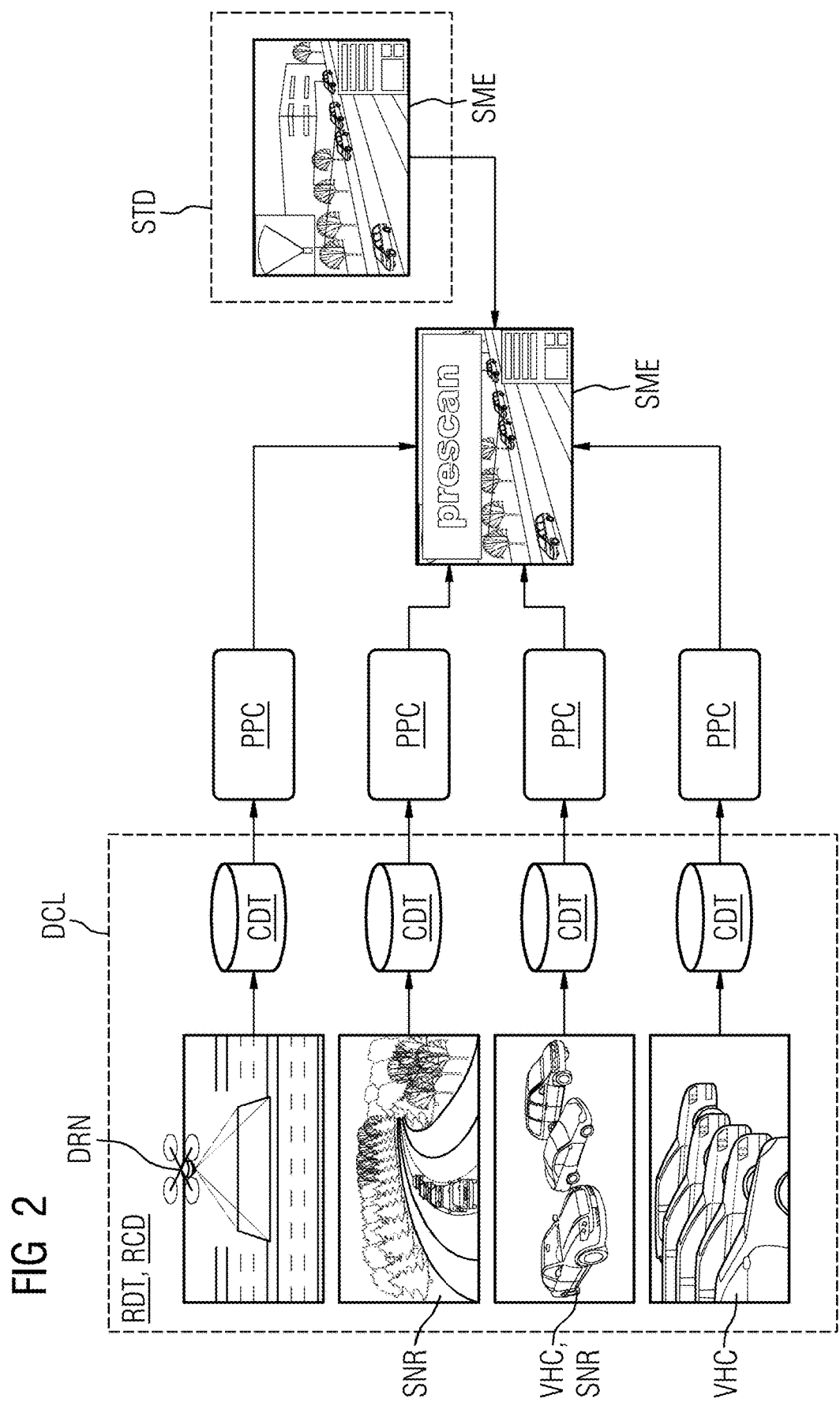
FIG. 2 shows different possible sources of data and methods of data collection.

FIG. 2 shows a simplified flow diagram illustrating the data collection DCL of act 1, which belongs to the first process PC1 of generating unknown-unsafe scenarios SUU, for example, in a specific scene SCN location.

For real data RDT 4, FIG. 2 shows four examples of data collection (see also FIG. 1), which involves using sensor SNR recordings of sensors SNR of: drones DRN; roadside sensors SNR; vehicles equipped with sensor SNR sets; a fleet of normal vehicles; or any combination thereof.

Then, the collected data may be processed (e.g., post processing PPC, such as for every sensor recording type differently) and imported to a simulation environment SME by generation of the 3D-environment.

The simulation environment SME and/or the post processing PPC enables to identify and fill occluded parts of the trajectories TRJ of the data collected. The occlusion may be filled by synthetic data SDT. Further, the data may be filtered for dynamic objects such that the trajectories are smooth. Filling occluded parts of the data set increases the possibility to extract basic scenario elements that are further explained below. Further, importing data into a simulation environment SME provides a possibility of enriching data by adding virtual sensors (e.g., additional synthetic data SDT) to the road users RUS.

The scene selection and extraction of basic scenario elements BSE of act 2 belongs to the next group of acts (b).

Figure 3:
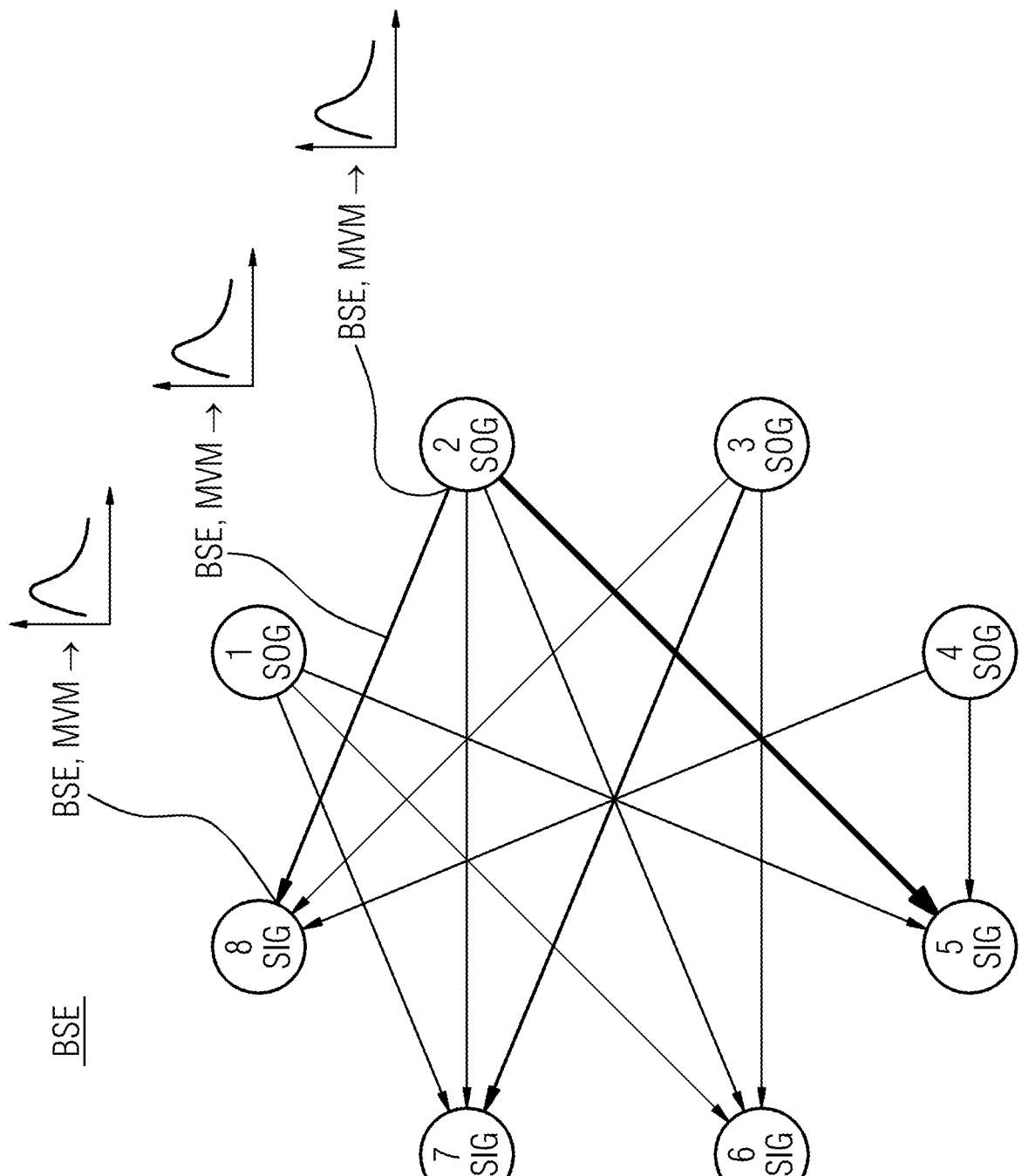
FIG. 3 shows a generated graph and hypothetical parameter distribution for source gate 1.
Figure 4:
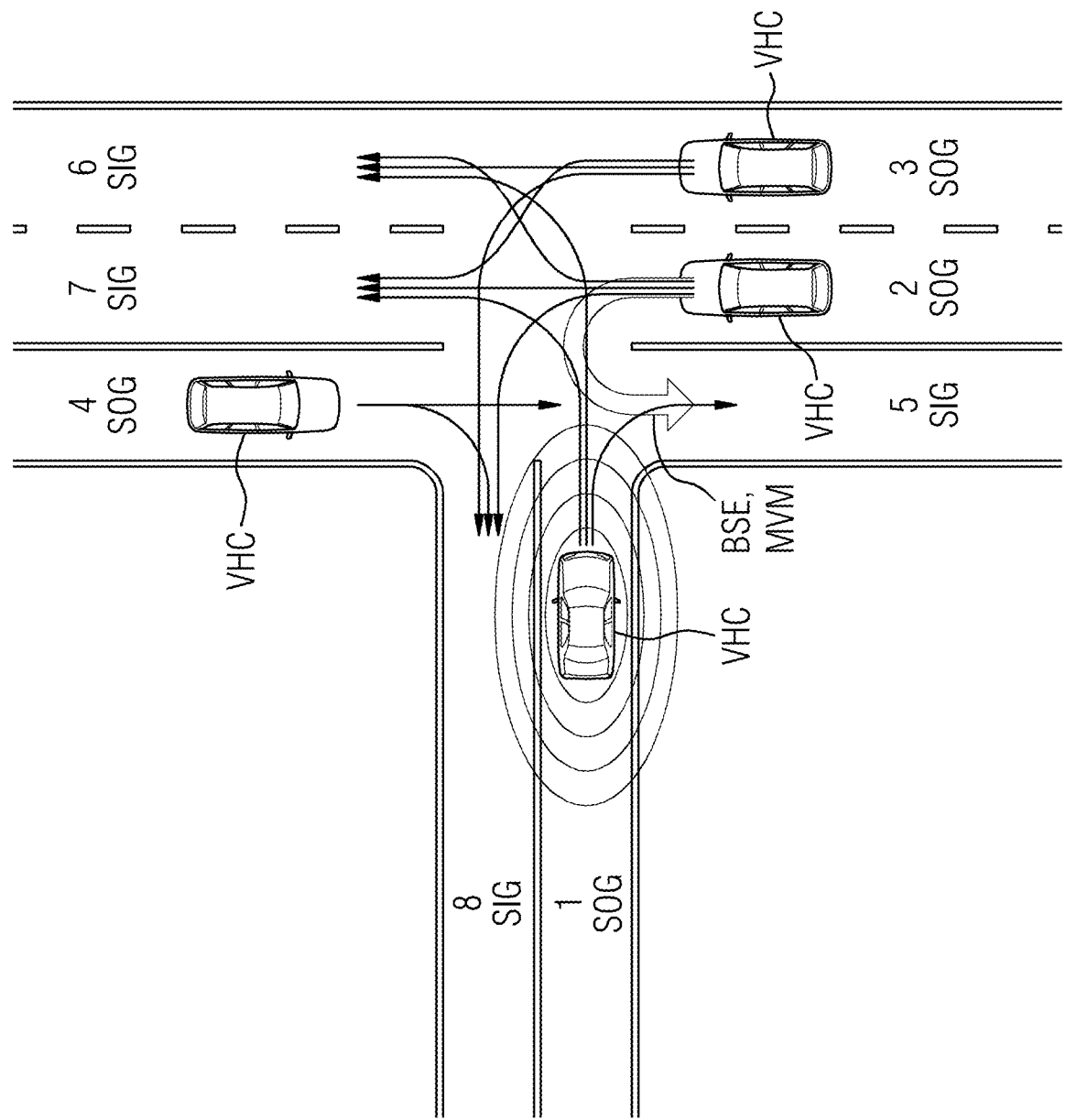
FIG. 4 shows source and sink gates in a scene location.

A graph-based approach (see FIGS. 3 and 4) may be used to extract basic scenario elements BSE from imported data to the simulation environment SME. First, source gates SOG (numbers 1, 2, 3, 4) and sink gates SIG (numbers 5, 6, 7, 8) are defined on the scene location (see FIG. 4). Then, the edge of the graph will be built based on the possibility of the movements from each of the source gates SOG to one of the sink gates SIG. Parameter distributions for these basic scenario elements BSE may be generated from the collected data CDT. For example, the movement MVM of a road user RUS may be abstracted in longitudinal direction by constant acceleration, constant speed, and constant acceleration, and lateral movement of a road user RUS may be abstracted in three movements MVM of constant curvature $(\rho)\_1=C\_1)$ transient curvature $((\rho)\_2=C\_2 (X,Y))$, and constant curvature $((\rho)\_3=C\_3)$. $C\_1$ and $C\_3$ are constant, and $C\_2$ is a function of X,Y position of the road user in global coordinate. Lane change (left/right), U-turn, turn (left/right) are examples of transient curvature functions.

The optimization toward unknown-unsafe scenarios SUU belongs to the next group of acts (c). According to the present embodiments, the optimization is a reduction of the plurality of different scenarios SCO to scenarios SCO that include a higher portion of unknown-unsafe scenarios SUU (e.g., that include only unknown-unsafe scenarios SUU).

Among the massive scenarios SCO, respectively (e.g., the plurality of different scenarios SCO and/or test cases generated in the previous act), only a limited number of cases are critical and therefore interesting to the designer. An optimization algorithm to find unknown unsafe scenarios SUU is to be provided. One important part of this optimization is the definition of a proper objective function that efficiently narrows down the possible massive scenarios SCO towards unknown unsafe scenarios SCO, which is referred to as severity indicator.

A severity indicator may be defined as the change of criticality over time. This may be expressed and respectively modelled that severity is defined as the time-derivative of the criticality indicator. For "Time To Collision" (TTC), which is one of the most widely used criticality indicators, the severity indicator may be modelled as (TTC))/dt, for example. A high value for the severity value indicates that the high criticality of the scenario SCO was not expected for the host vehicle and therefore may be categorized as an unknown scenario.

Figure 5:
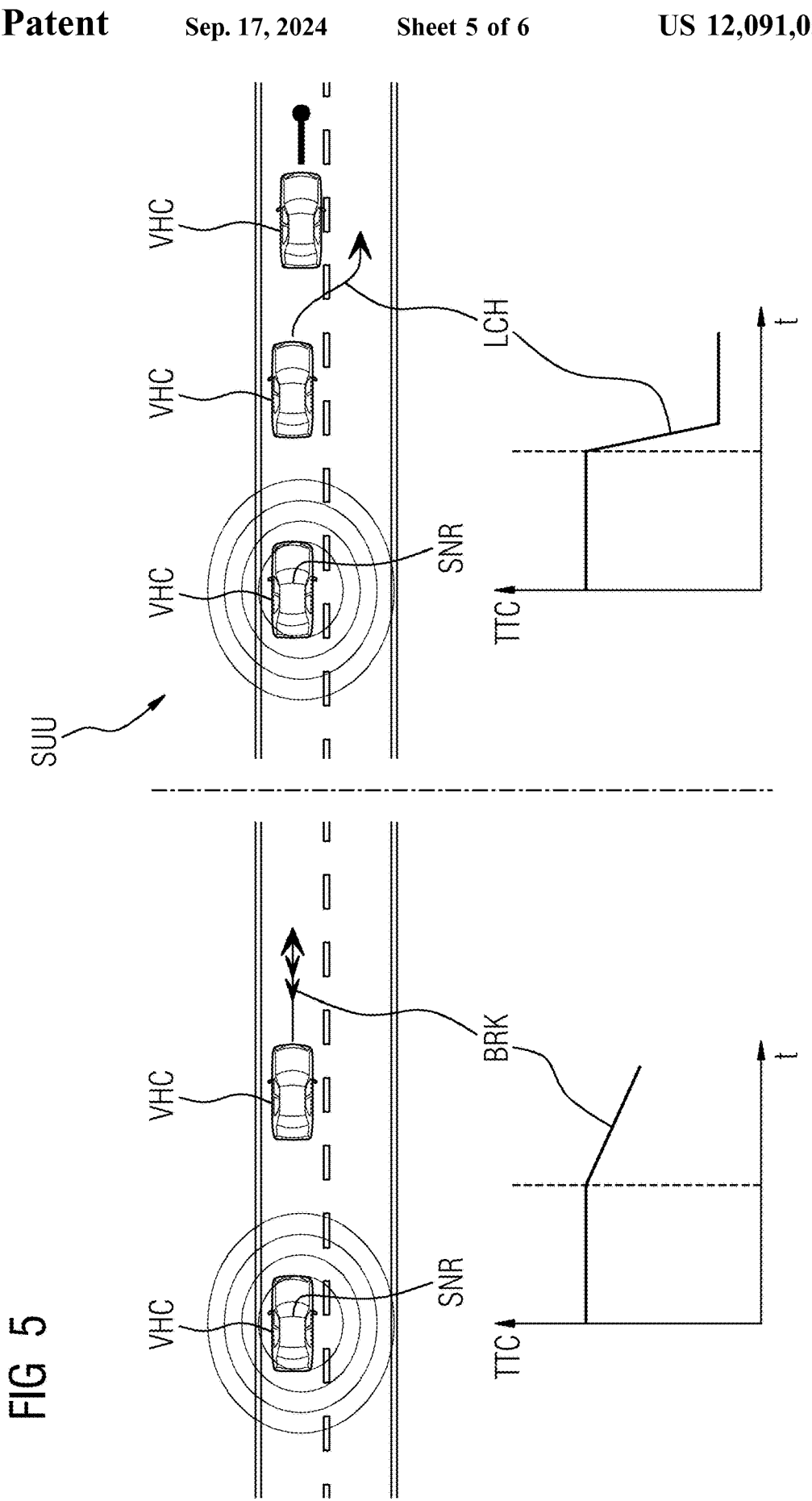
FIG. 5 shows known-unsafe scenario (top left), unknown-unsafe scenario (top right), smooth reduction of time to collision due to heavy braking of preceding vehicle (bottom left), and abrupt drop-in time to collision due to severe lane change of preceding vehicle (bottom right)

FIG. 5 shows two different scenarios where the host vehicle VHC equipped with a forward-looking sensor SNR may only detect one vehicle VHC in front of the host vehicle VHC. On the left, the host vehicle approaches a preceding vehicle VHC that is braking heavily BRK. In this case, the criticality is high as the TTC becomes smaller. However, the derivative term is not large, as the host vehicle VHC has clear line of sight and may thus detect that the preceding vehicle VHC is braking BRK in a timely fashion. On the right, the preceding vehicle performs a sudden lane change LCH due to a stationary vehicle VHC. In this case, the TTC decreases more abruptly, which provides this scenario SCO was not expected and therefore an unknown scenario SUU to the host vehicle VHC.

The introduced severity indicator may be used by a method (e.g., a nonlinear method) to improve (e.g., optimize) the safety of an automated vehicle, and the severity indicator may be implemented in improvement or optimization apparatuses or processes (e.g., HEEDS, a Siemens software for optimization). To avoid producing physical impossible scenarios SCO, constraints may be applied to the model of the host vehicle VHC, other road users RUS, and the environment 3DE in the simulation environment SME (e.g., Simcenter Prescan—a Siemens software for vehicle, sensors, and environment modeling, a simulation tool used for environment and sensor simulation).

To find as many unknown-unsafe scenarios SUU as possible in a certain scene SCN, not only the scenario SCO with the highest value of severity may be considered (e.g., global maximum). Other scenarios that may represent a local maximum for the severity indicator may be extracted as well. To do so, a multiple objective optimization approach may be used to escape from local optima and to find all possible local optima as well as the global optimum.

In this context, FIG. 6 shows a scene in which a road user RUS (e.g., a pedestrian PDS) suddenly walks out into the road, and the other vehicle changes lane into the host vehicle lane due to a stationary bus. This may produce at least two different critical scenarios SCO, as is illustrated by FIG. 6. A solution may be found first (shown as a global maximum for the severity) when the host vehicle is very close to the other road user RUS: vehicles VHC at the time the other vehicle VHC performs its lane change, as illustrated. A second solution (e.g., local maximum) is found where the host vehicle VHC is very close to the pedestrian PDS, and then, the pedestrian PDS walks into the road. Since the pedestrian PDS is blocked from view by parked vehicles VHC, this produces an unsafe-unknown scenario SUU situation for the host vehicle VHC. The above scenarios SCO show clearly different states of road users RUS. This example shows how the multiple objective optimization approach helps to find the global GLM and local LOM maximum based on the difference in the states.

Using only the criticality function will find unsafe-known scenarios that may be significantly less efficient. According to the present embodiments, a novelty function is implemented by the time derivative, and therefore, the present embodiments are capable of finding unknown-unsafe scenarios in compliance with SOTIF standard. Consequently, the amount of testing required in a simulation environment SME for verification and validation of ADAS or AD functions may be reduced significantly.

The advantages of the present embodiments may be summarized below: Creation of the unknown-unsafe scenarios without starting with initial concrete scenarios; and a novelty function that is capable of finding unknown-unsafe scenarios according to SOTIF standard. Smart data collection may be provided. This is synergistically efficient with data collection on specific scene SCN locations that increases efficiency of the data collection and increases the likelihood of finding rare cases in one location. Importing data to simulation environment SME may increase the possibility to explore more complete parameter distributions as well as enriching the data by virtually adding sensors SNR in the simulation environment SME.

Although the invention has been described in detail with reference to embodiments, it is to be understood that the present invention is not limited by the disclosed examples, and that numerous additional modifications and variations may be made thereto by a person skilled in the art without departing from the scope of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A computer-implemented method for generating unknown-unsafe scenarios, the computer-implemented method comprising:
providing, in a first process, a plurality of different scenarios;
reducing, in a second process, the plurality of different scenarios to scenarios that comprise a higher portion of unknown-unsafe scenarios,
wherein the second process comprises:
reducing the plurality of different scenarios toward the higher portion of unknown-unsafe scenarios, the reducing of the plurality of different scenarios toward the higher portion of unknown-unsafe scenarios comprising determining, for each scenario of the plurality of different scenarios, a severity indicator as a change of criticality over time and discarding scenarios of the plurality of different scenarios for which the respective severity indicator does not exceed a predefined threshold,
wherein the severity indicator is defined as a time derivative of a criticality indicator,
wherein the criticality indicator is a prognosed time-to-collision, and
wherein the severity indicator is modelled as a time derivative of the prognosed time-to-collision.

2. The computer-implemented method of claim 1, wherein the first process comprises:
collecting data and importing the data to a simulation environment by generation of a 3D-environment;
selecting a scene and extracting basic scenario elements from the scene; and
selecting a number of road users, selecting a type of each road user of the number of road users, and generating the plurality of different scenarios.

3. The method of claim 2, wherein collecting data comprises:
using sensor recordings of sensors of drones, roadside sensors, vehicles equipped with sensor sets, a fleet of normal vehicles, or any combination thereof.

4. The method of claim 1, wherein the first process further comprises:
identifying at least one occluded part of at least one trajectory of at least one road user in the 3D-environment, and filling the at least one occluded part;
adding virtual sensors to at least one road user; or
a combination thereof.

5. A method for improving safety of an automated vehicle, the method comprising:
providing a driver assistance system, the driver assistance system comprising at least one processor, the at least one processor being configured for controlling interventions semi-autonomously or autonomously in operation of the automated vehicle, the at least one processor being configured for controlling interventions semi-autonomously or autonomously comprising the at least one processor being configured for providing ADAS-parameter settings for configuring controlling behavior of the interventions;

providing the ADAS-parameter settings;

testing at least parts of the driver assistance system in a loop with a simulation of at least one unknown-unsafe scenario generated by a computer-implemented method for generating unknown-unsafe scenarios with a number of different parameter settings, the computer-implemented method comprising providing, in a first process, a plurality of different scenarios and reducing, in a second process, the plurality of different scenarios to scenarios that comprise a higher portion of unknown-unsafe scenarios, wherein the second process comprises reducing the plurality of different scenarios toward the higher portion of unknown-unsafe scenarios, the reducing of the plurality of different scenarios toward the higher portion of unknown-unsafe scenarios comprising determining, for each scenario of the plurality of different scenarios, a severity indicator as a change of criticality over time and discarding scenarios of the plurality of different scenarios for which the respective severity indicator does not exceed a predefined threshold, wherein the severity indicator is defined as a time derivative of a criticality indicator, wherein the criticality indicator is a prognosed time-to-collision, and wherein the severity indicator is modelled as a time derivative of the prognosed time-to-collision;

selecting at least one parameter setting of the number of different parameter settings performing better than the other parameter settings regarding predefined criteria;

configuring the driver assistance system of the automated vehicle by one parameter setting of the selected at least one parameter setting; and driving the automated vehicle with the configured driver assistance system.

6. An apparatus comprising:
at least one processor configured to generate unknown-unsafe scenarios, the at least one processor being configured to generate unknown-unsafe scenarios comprising the at least one processor being configured to:
provide, in a first process, a plurality of different scenarios;
reduce, in a second process, the plurality of different scenarios to scenarios that comprise a higher portion of unknown-unsafe scenarios,
wherein the second process comprises:
reduction of the plurality of different scenarios toward the higher portion of unknown-unsafe scenarios, the reduction of the plurality of different scenarios toward the higher portion of unknown-unsafe scenarios comprising determination, for each scenario of the plurality of different scenarios, a severity indicator as a change of criticality over time and discardment of scenarios of the plurality of different scenarios for which the respective severity indicator does not exceed a predefined threshold,
wherein the severity indicator is defined as a time derivative of a criticality indicator,
wherein the criticality indicator is a prognosed time-to-collision, and
wherein the severity indicator is modelled as a time derivative of the prognosed time-to-collision.

7. The apparatus of claim 6, wherein the at least one processor is further configured, in the first process, to:
collect data and import the data to a simulation environment by generation of a 3D-environment;
select a scene and extract basic scenario elements from the scene; and
select a number of road users, select a type of each road user of the number of road users, and generate the plurality of different scenarios.

8. The apparatus of claim 7, wherein the at least one processor being configured to collect data comprises the at least one processor being configured to:
use sensor recordings of sensors of drones, roadside sensors, vehicles equipped with sensor sets, a fleet of normal vehicles, or any combination thereof.

9. The apparatus of claim 6, wherein the at least one processor is further configured, in the first process, to:
identify at least one occluded part of at least one trajectory of at least one road user in the 3D-environment, and fill the at least one occluded part;
add virtual sensors to at least one road user; or
a combination thereof.

* * * * *